US010451667B2

(12) United States Patent
Steele et al.

(10) Patent No.: US 10,451,667 B2
(45) Date of Patent: *Oct. 22, 2019

(54) APPARATUS AND METHOD FOR TESTING A CAPACITIVE TRANSDUCER AND/OR ASSOCIATED ELECTRONIC CIRCUITRY

(71) Applicant: Cirrus Logic International Semiconductor Ltd., Edinburgh (GB)

(72) Inventors: Colin Findlay Steele, Edinburgh (GB); John L. Pennock, Midlothian (GB)

(73) Assignee: Cirrus Logic, Inc., Austin, TX (US)

( * ) Notice: Subject to any disclaimer, the term of this patent is extended or adjusted under 35 U.S.C. 154(b) by 362 days.

This patent is subject to a terminal disclaimer.

(21) Appl. No.: 15/433,613

(22) Filed: Feb. 15, 2017

(65) Prior Publication Data

US 2017/0160337 A1 Jun. 8, 2017

Related U.S. Application Data

(63) Continuation of application No. 14/156,723, filed on Jan. 16, 2014, now Pat. No. 9,575,116, which is a continuation of application No. 12/649,623, filed on Dec. 30, 2009, now Pat. No. 8,643,382.

(30) Foreign Application Priority Data

Dec. 30, 2008 (GB) .................................. 0823664.8

(51) Int. Cl.

| | |
|---|---|
| ***G01R 31/08*** | (2006.01) |
| ***G01R 31/12*** | (2006.01) |
| ***G01R 31/28*** | (2006.01) |
| ***H04R 29/00*** | (2006.01) |
| ***B81B 7/00*** | (2006.01) |
| ***B81C 99/00*** | (2010.01) |
| *H04R 19/00* | (2006.01) |

(52) U.S. Cl.

CPC .......... *G01R 31/2829* (2013.01); *B81B 7/008* (2013.01); *B81C 99/004* (2013.01); *G01R 31/2884* (2013.01); *H04R 29/004* (2013.01); *H01L 2224/05554* (2013.01); *H01L 2224/48091* (2013.01); *H01L 2224/48137* (2013.01); *H04R 19/005* (2013.01); *H04R 2201/003* (2013.01)

(58) Field of Classification Search

CPC ............ G01R 33/0286; G01R 31/2884; H03H 2015/005; H04R 29/004; H04R 19/005; H01L 2224/48137; H01L 2224/48091; H01L 2224/05554; H01L 2924/00014; H01L 2924/1461

See application file for complete search history.

(56) References Cited

U.S. PATENT DOCUMENTS

| | | | | |
|---|---|---|---|---|
| 5,400,297 | A * | 3/1995 | Frederiksen ....... | G01R 31/2829 367/13 |
| 6,098,027 | A | 8/2000 | Yang | |
| 6,297,643 | B2 | 10/2001 | De Jong et al. | |
| 6,744,264 | B2 | 6/2004 | Gogoi et al. | |

(Continued)

FOREIGN PATENT DOCUMENTS

WO WO-92/21982 A1 12/1992

*Primary Examiner* — Son T Le
(74) *Attorney, Agent, or Firm* — Blank Rome LLP

(57) ABSTRACT

A method of testing a capacitive transducer circuit, for example a MEMS capacitive transducer, by applying a test signal via one or more capacitors provided in the transducer circuit.

18 Claims, 12 Drawing Sheets

(56) References Cited

U.S. PATENT DOCUMENTS

| | | | | |
|---|---|---|---|---|
| 6,856,144 | B2 | 2/2005 | Lasalandra et al. | |
| 7,232,699 | B1 * | 6/2007 | Lagnado | H01G 5/019 257/E23.048 |
| 7,616,077 | B1 | 11/2009 | Wittwer et al. | |
| 7,786,738 | B2 | 8/2010 | Lang et al. | |
| 8,215,151 | B2 | 7/2012 | Sammoura et al. | |
| 8,536,881 | B2 | 9/2013 | Lin et al. | |
| 2003/0201777 | A1 | 10/2003 | Gogoi et al. | |
| 2006/0147062 | A1 | 7/2006 | Niwa | |
| 2007/0080695 | A1 | 4/2007 | Morrell et al. | |
| 2007/0205772 | A1 | 9/2007 | Woehrle | |
| 2009/0279719 | A1 * | 11/2009 | Lesso | B06B 1/0292 381/174 |
| 2010/0167430 | A1 | 7/2010 | Steele et al. | |

* cited by examiner

Vstim1
Figure 2c
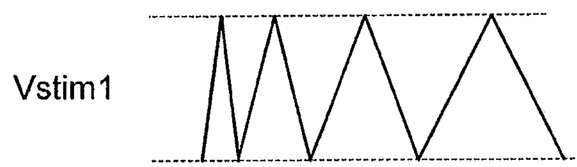
Figure 2d
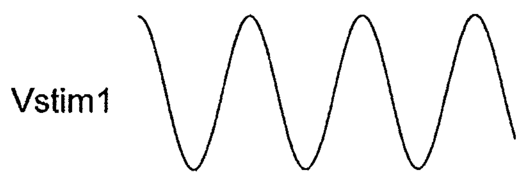
Figure 2e

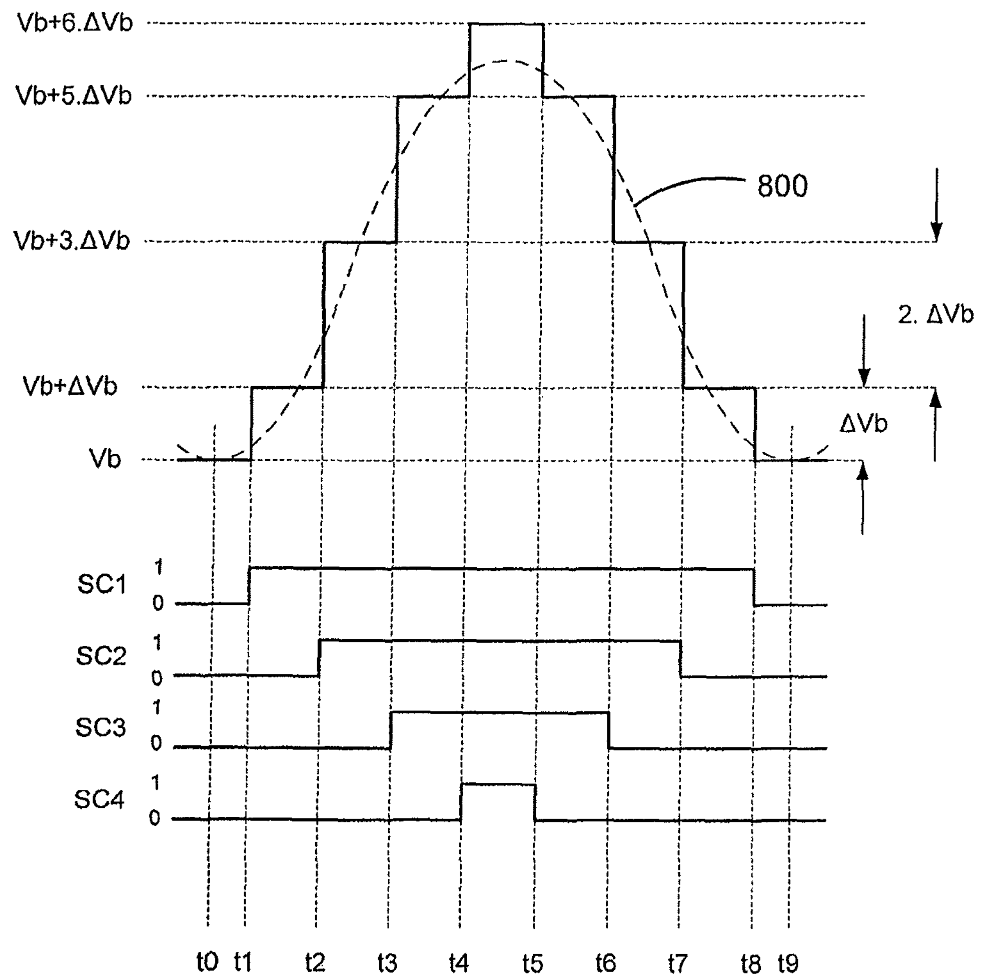
Figure 7a
Figure 7b
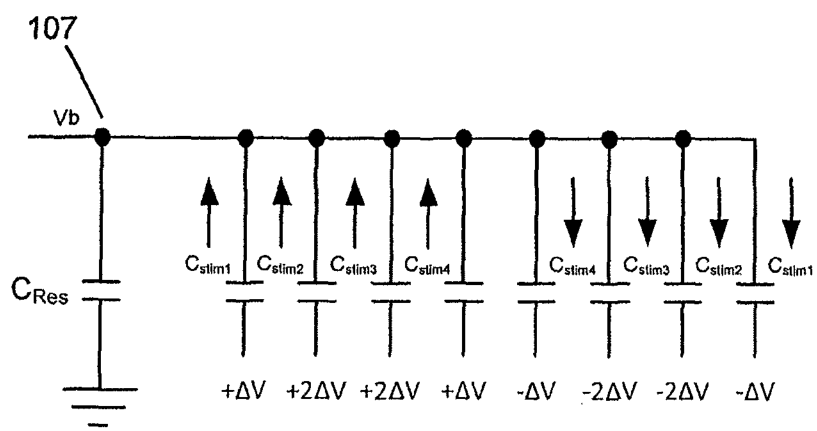
Figure 7c

APPARATUS AND METHOD FOR TESTING A CAPACITIVE TRANSDUCER AND/OR ASSOCIATED ELECTRONIC CIRCUITRY

This is a continuation of U.S. patent application Ser. No. 14/156,723, filed Jan. 16, 2014, which is a continuation of U.S. patent application Ser. No. 12/649,623, filed Dec. 30, 2009, which claims priority under 35 U.S.C. 119 to UK Patent Application No. 0823664.8, filed Dec. 20, 2008.

BACKGROUND OF THE INVENTION

1. Field of the Invention

This invention relates to the field of capacitive transducers and associated electronic circuitry, and relates in particular, but not exclusively, to an apparatus and method for testing capacitive transducers and/or their associated electronic circuitry, for example micro-electrical-mechanical systems (MEMS) capacitive transducers and their associated circuitry.

2. Description of the Related Art

Consumer electronics devices are continually getting smaller and, with advances in technology, are gaining ever increasing performance and functionality. This is clearly evident in the technology used in consumer electronic products such as, for example, mobile phones, laptop computers, MP3 players and personal digital assistants (PDAs). Requirements of the mobile phone industry, for example, are driving components to become smaller with higher functionality and reduced cost. For example, some mobile phones now require multiple microphones for noise cancelling, or accelerometers to allow inertial navigation, while maintaining or reducing the small form factor and aiming at a similar total cost to previous generation phones.

This has encouraged the emergence of miniature transducers. For example, in respect to speech applications, initially electret microphones were used to capture speech, but more recently micro-electrical-mechanical (MEMS) transducers have been introduced. MEMS transducers may be used in a variety of applications including, but not limited to, pressure sensing, ultrasonic scanning, acceleration monitoring and signal generation. Traditionally such MEMS transducers are capacitive transducers some of which comprise one or more membranes with electrodes for read-out/drive deposited on the membranes and/or a substrate. Relative movement of these electrodes modulates the capacitance between them, which then has to be detected by associated electronic circuitry such as sensitive electronic amplifiers.

FIG. 1 illustrates a schematic diagram of a MEMS device 99 comprising a MEMS transducer 100 and an electronic circuit 102.

The MEMS transducer 100 is shown as being formed on a separate integrated circuit to the electronic circuit 102, the two being electrically connected using, for example, bond wires 112, 124. The MEMS transducer 100 comprises a MEMS capacitor $C_{MEMS}$ having first and second plates 118, 120 that are respectively connected to first and second bond pads 114, 122.

The electronic circuit 102 comprises a charge pump 104, a diode 106, a reservoir capacitor ($C_{Res}$) 108, an amplifier 128, a bias circuit 131, third, fourth, and fifth bond pads 110, 126 and 130, and an optional digital-to-analogue converter (DAC) 132 with an associated sixth bond pad 134.

The following now describes the basic operation of the MEMS device.

The charge pump 104 receives a supply voltage VDD and a first reference voltage $V_{REF1}$ and outputs an output voltage VDD* (that is greater than the supply voltage VDD). The output voltage VDD* charges up the reservoir capacitor 108, via the diode 106, to a first bias voltage Vb. The reservoir capacitor 108 supplies a relatively stable, i.e. clean, voltage Vb, via the bond pad 110, the bond wire 112 and the bond pad 114, so as to bias the first plate 118 of the MEMS capacitor $C_{MEMS}$.

The MEMS capacitor $C_{MEMS}$ outputs, via the second bond pad 122, an analogue voltage signal in response to a sound pressure wave.

The amplifier 128 receives, via the bond pad 122, the bond wire 124 and the bond pad 126 the analogue voltage signal from the MEMS capacitor $C_{MEMS}$, and amplifies the analogue voltage signal. The amplified analogue signal, which may be a current or a voltage depending upon the type of amplifier used, is then output, for further processing, via the fifth bond pad 130. Alternatively, the electronic circuitry 102 may comprise a DAC 132, in which case, the amplified analogue signal is output, via the sixth bond pad 134, as a digital signal. The digital signal may be output instead of, or in addition to, the amplified analogue signal. The amplifier also receives from the bias circuit 131, a second bias voltage $V_{REF2}$ via a bias impedance (not illustrated). The second bias voltage $V_{REF2}$ also biases the second plate 120 of the MEMS capacitor $C_{MEMS}$.

As can be seen in FIG. 1, a transducer ($C_{MEMS}$) can be fabricated on a separate integrated circuit to its associated electronic circuitry. The separate integrated circuits (100, 102) can either be packaged separately, or mounted on a common substrate within the same package. When the transducer and associated electronic circuitry are formed on separate integrated circuits, interconnecting elements such as bond wires (for example bond wires 112, 124 shown in FIG. 1), or studs, bumps etc. are used to electrically interconnect the separate integrated circuits 100, 102. It should be noted that a transducer and its associated electronic circuitry can also be fabricated on the same integrated circuit, i.e. a fully integrated solution. The present invention is also applicable and/or adaptable to such fully integrated solutions.

As with conventional silicon technology, MEMS technology allows much of the manufacturing process to be performed on many devices at once, on a whole wafer containing thousands of devices, or even a batch of dozens of wafers. This fundamentally reduces production cost. Wafer-scale packaging techniques may also be used with similar benefits.

However, the production process contains many steps, not only the silicon-level processing steps, but also later steps, for example placing the transducer on a common underlying substrate with the amplifier and biasing electronics, adding bond wires between the transducer and the electronics and from the electronics to terminals on the substrate, covering the assembly with protective material, and adding a case to cover the assembly. At each stage, processing errors may occur, or random defects may degrade the device, so it is desirable to be able to test the functionality of the sub-components and their interconnections as soon as possible in the manufacturing process, to avoid wasting the cost of materials and processing devices that will be rejected at final test.

It is not straightforward to apply conventional wafer-test techniques to capacitive transducers. For example, in the case of a microphone application, it is impractical to apply a controlled acoustic stimulus to each MEMS die on a wafer.

Also, because of the very low capacitance of the sensor (possibly less than 1 pf), and hence the small input capacitance necessary of the amplifier electronics, there may be little or no electrostatic discharge (ESD) protection on the amplifier input, so these inputs are liable to damage if probed directly during testing. Also the amplifier performance may be altered by the parasitic capacitance of the probes being applied to its input. Therefore, it is desirable to be able to test the functionality, electrical continuity or performance of the device with neither an acoustic stimulus nor direct electrical contact to sensitive circuit nodes.

Furthermore, the need for low cost and high volume means that the test time should be as short as possible, so preferably tests for gross failure modes should be performed and samples failing these functional tests should be removed from test before any time-consuming precision tests are carried out. Once a production line is characterised and under Statistical Process Control, a largely functional test may be adequate to obtain a low defect rate. However, even on a mature process there is the need for occasional auditing and re-characterisation to allow yield optimisation or to help diagnose the causes of any reduction in yield. It is useful to be able to access different nodes in any circuitry to provide clues to any yield sensitivity, for example to localise a problem to a particular part of the circuitry.

However one problem in fully testing finished devices is that because of size constraints on the overall package size, there may only be a very small number of external connections to the transducer/circuit assembly, possibly as few as three (ground, supply, and output). This makes it difficult to access internal nodes in a circuit, so as to apply electrical signals to these nodes, for such test and diagnostic purposes.

The present invention seeks to provide a method of testing a high input impedance transducer, such as a capacitive transducer for example that may be realised as a MEMS transducer, and/or its associated electronics, that allows test stimuli to be applied without a physical stimulus (e.g. pressure stimulus) or direct external electrical connection to critical nodes (e.g. probing sensitive nodes), while not impacting performance nor requiring complex additional circuitry.

SUMMARY OF THE INVENTION

According to a first aspect of the present invention, there is provided an integrated circuit having a node for connection to a capacitive transducer. The integrated circuit comprises: a capacitor having a first plate and a second plate, the first plate being connected to the node; and switching means coupled to the second plate of the capacitor for selectively coupling a test signal via the capacitor to the node during a test mode of operation.

According to another aspect of the present invention, there is provided a method of testing a signal path of an integrated circuit, or electronic circuitry coupled to the signal path, the signal path having a capacitor coupled to a node on the signal path, the method comprising the step of selectively applying a test signal to the signal path via the capacitor.

The invention has the advantage of enabling a transducer and/or electronic circuitry associated with a transducer to be tested during production, but without having the disadvantages mentioned with the prior art. For example, by using a capacitor already present on the electronic circuit the invention enables the transducer and/or electronic circuitry to be tested without significantly increasing the chip-area required. The invention also has the advantage that the test signal can be applied in a manner that does not require probing of sensitive nodes, and hence does not damage the electronic circuitry. Also, when providing the test source on the same integrated circuit, i.e. on-chip, the invention does not place any burden on the number of I/O pads being used.

According to a further aspect of the present invention there is provided a method of testing an assembly comprising a first integrated circuit comprising a capacitive transducer and a second integrated circuit comprising associated electronic circuitry. The method comprises the steps of: mounting the first integrated circuit and the second integrated circuit on a common substrate; and testing the first and/or second integrated circuit using the method as defined in the appended claims, prior to the step of electrically connecting the first integrated circuit and the second integrated circuit.

According to another aspect of the present invention, there is provided a method of testing an assembly comprising a first integrated circuit comprising a capacitive transducer and a second integrated circuit comprising associated electronic circuitry. The method comprises the steps of: mounting the first integrated circuit and the second integrated circuit on a common substrate; electrically connecting the first integrated circuit and the second integrated circuit; and testing the first and/or second integrated circuit using the method as defined in the appended claims.

BRIEF DESCRIPTION OF THE DRAWINGS

For a better understanding of the invention, and to show more clearly how it may be carried into effect, reference will now be made, by way of example only, to the accompanying drawings in which:

FIGS. 2*b* to 2*f* illustrate test signals that may be used with the embodiments of FIG. 2*a*, 3 or 4;

FIGS. 7*a* to 7*c* illustrate a test signal and switching waveforms relating to the embodiment of FIG. 6;

DETAILED DESCRIPTION OF THE PREFERRED EMBODIMENTS

The description of the embodiments below will be made in relation to a MEMS device in the form of an analogue/ digital microphone. However, it will be appreciated that some or all aspects of the present invention may also be applicable to any other type of high input impedance, or small output signal, transducers such as capacitive MEMS devices and/or capacitive transducers, including non-MEMS type capacitive transducers.

Figure 1:
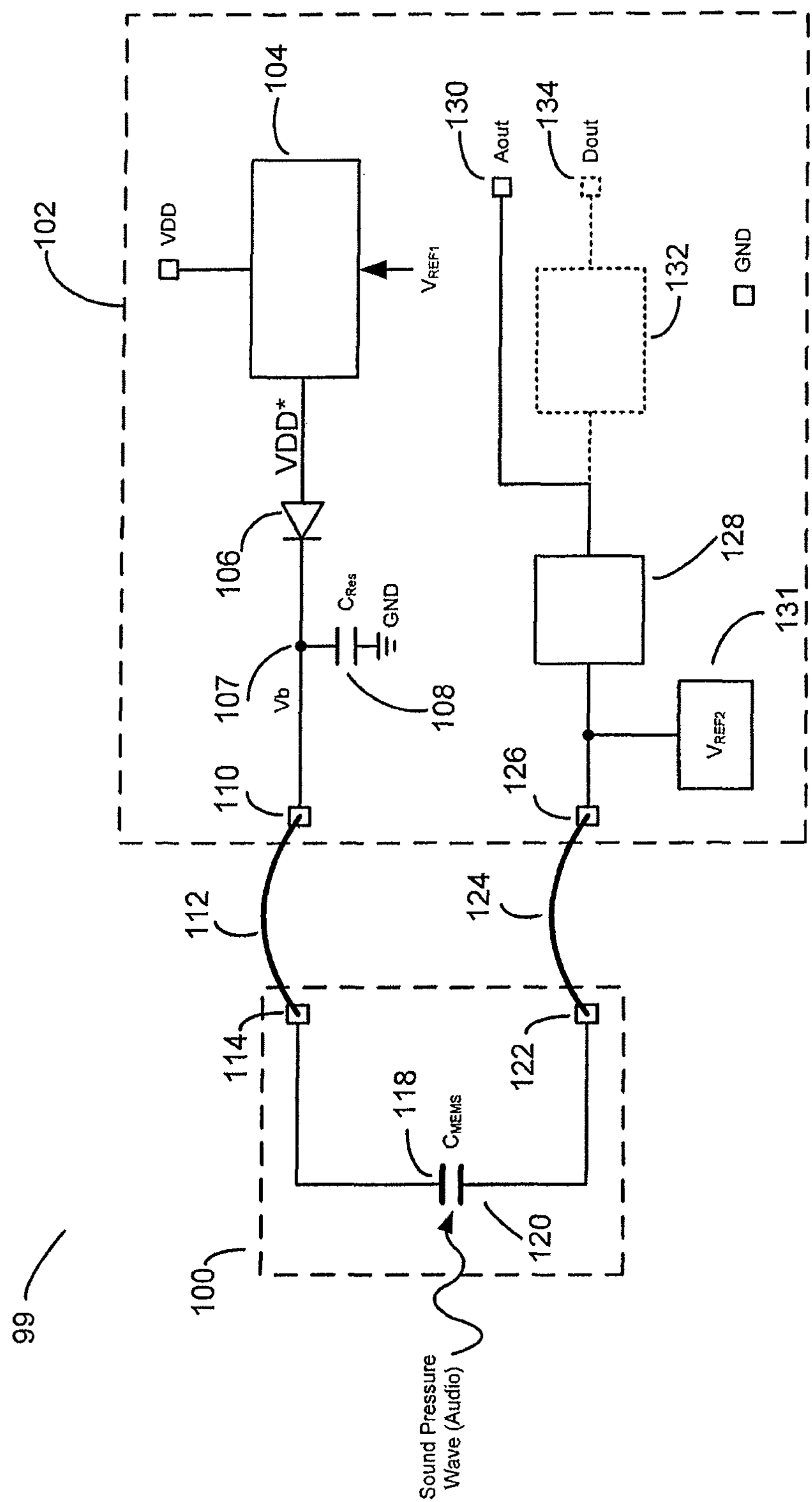
FIG. 1 is a schematic diagram of a MEMS transducer interfaced with electronic circuitry.
Figure 2A:
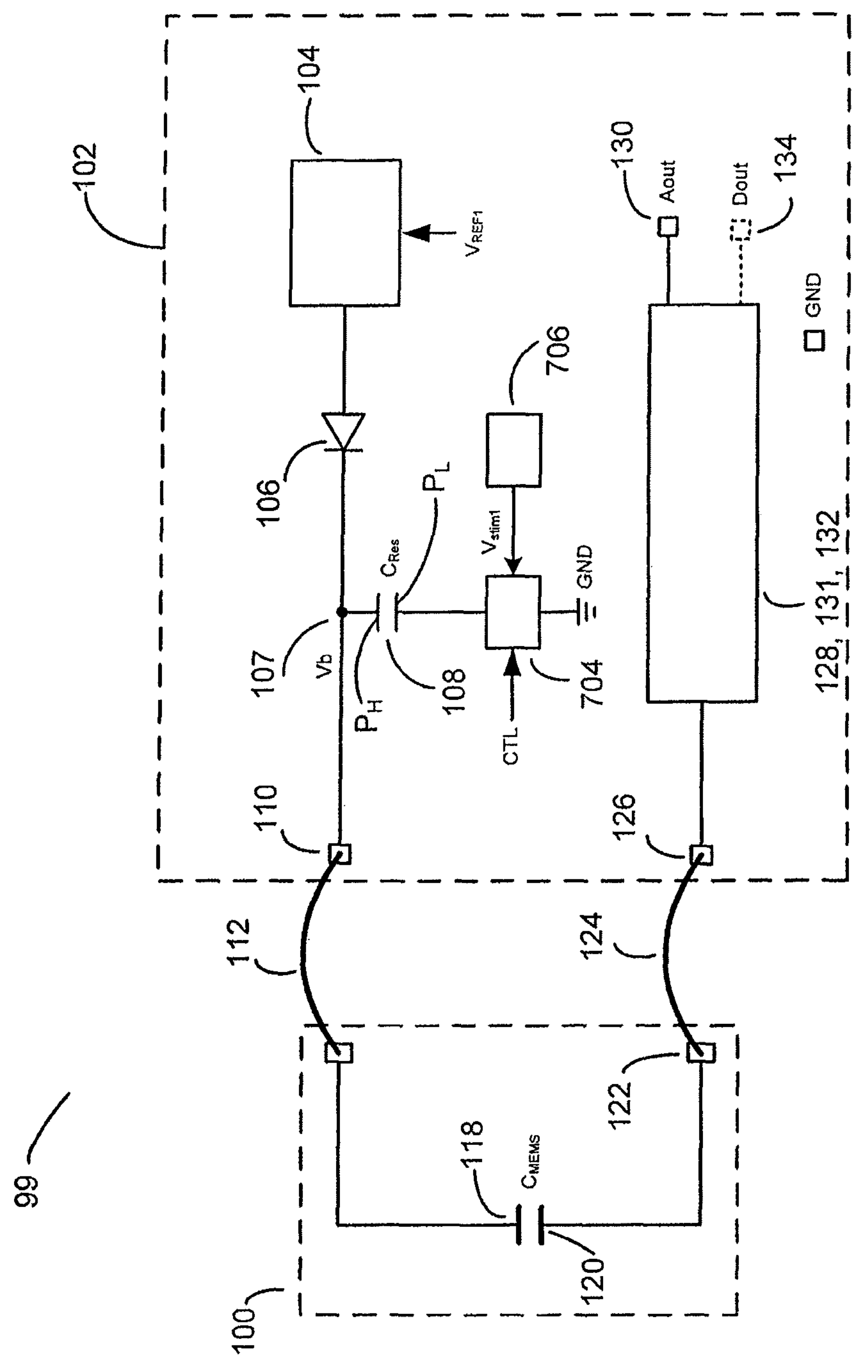
FIG. 2*a* is a schematic diagram of a MEMS transducer interfaced with electronic circuitry, and having a circuit for testing the MEMS transducer and/or the electronic circuitry according to one embodiment of the invention.

According to a first aspect of the invention there is provided an arrangement shown in FIG. 2*a*. FIG. 2*a* is similar to the arrangement of FIG. 1, with common features having common reference numbers. It is noted that certain features have been simplified for clarity in order to highlight the invention. According to the embodiment of FIG. 2*a* a switch 704 is provided for selectively connecting, by means of a control signal (CTL), a first test signal $V_{stim1}$ from a signal source 706 to the MEMS capacitor $C_{MEMS}$ via the reservoir capacitor ($C_{Res}$) 108. According to one embodiment the control signal CTL and/or signal source 706 are controlled by a test mode signal (not illustrated). 1. As such, a node 107 in the circuit (for connection to the MEMS capacitor $C_{MEMS}$) is coupled to a first plate of the reservoir capacitor 108, the second plate of the reservoir capacitor 108 being coupled, via the switch 704, to selectively receive a test signal during a test mode of operation.

Referring to FIG. 2*a*, in normal operation, the reservoir capacitor 108 is very lightly loaded. Or in other words, there is very little current drawn from the charge pump 104 other than possibly a small amount of leakage of current due to parasitic elements associated with node 107 (i.e. the high-side plate $P_H$ of the reservoir capacitor 108) and/or the transducer 100. Any leakage current will typically be in the order of nanoAmperes (nA) or less. Therefore, the bias voltage Vb across the reservoir capacitor 108 will be substantially constant, i.e. the bias voltage Vb will be in a state of substantial equilibrium. The diode 106 will only conduct when the charge on the reservoir capacitor depletes enough to forward bias the diode 106, which will be relatively infrequent. Therefore, the diode 106 presents a high impedance when looking into the charge pump 104 from node 107. Although not illustrated, the diode 106 in FIG. 2*a* could be suitably replaced by some other form of high impedance component. One such suitable high impedance component could be a switched capacitor filter that acts as a high value resistor.

Figure 2B:
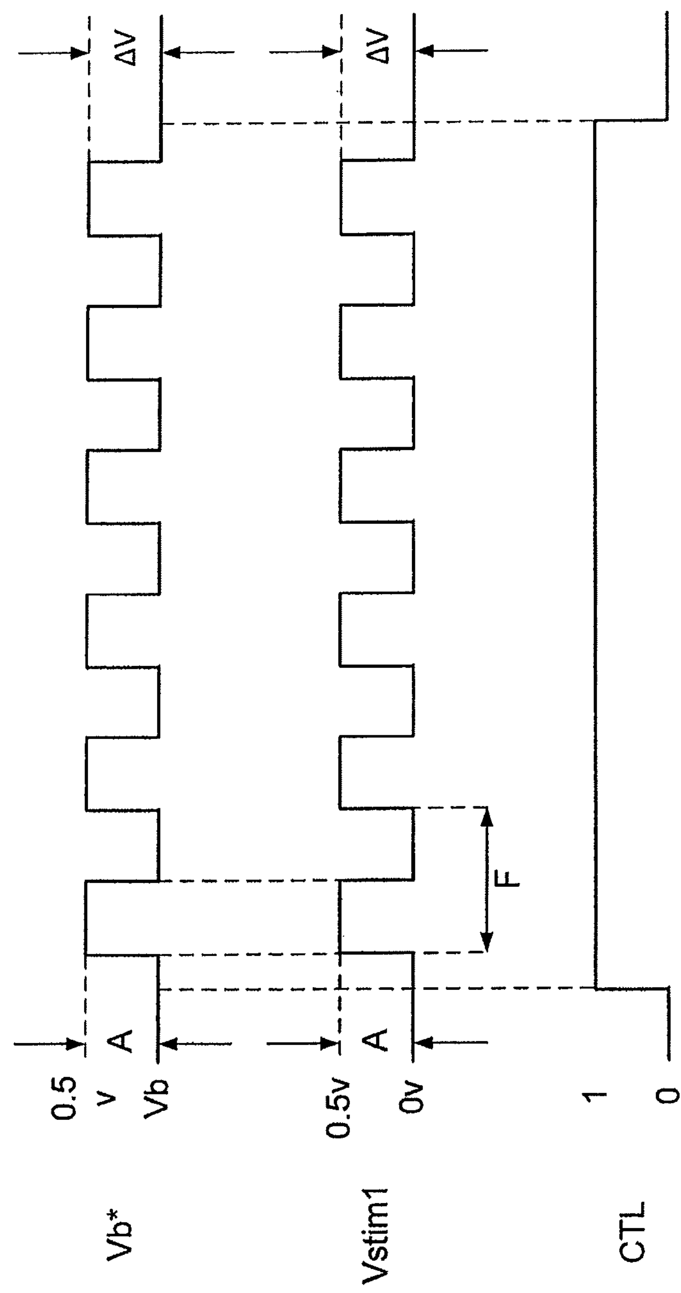

FIG. 2*b* illustrates example signals and voltages associated with test signal arrangement of FIG. 2*a* when the arrangement is in a test mode.

Referring to FIG. 2*b*, the control signal CTL changes from a low state (i.e. logic zero or off) to a high state (i.e. logic one or on), thereby enabling or switching on the switch 704. The enabled switch 704 thereby connects the test signal $V_{stim1}$ from the signal source 706 to the bottom, i.e. low-side, plate $P_L$ of the reservoir capacitor 108. Therefore, in a test mode, the test signal $V_{stim1}$ has the effect of biasing the bottom plate $P_L$ of the reservoir capacitor 108 between first and second voltages, i.e. the test signal "pumps" the bottom plate $P_L$ of the reservoir capacitor 108 thus superimposing the test signal $V_{stim1}$ upon the otherwise stable bias voltage Vb that is present on the high-side plate $P_H$ of the reservoir capacitor 108.

Since the diode 106 and transducer 100 present a greater individual and combined impedance (including associated parasitic elements) to the test signal than the impedance of the reservoir capacitor 108, the diode does not have any, or very little, effect in attenuating the test signal such that all of the test signal, or substantially all of the test signal, appears at the high-side plate 118 of the capacitive transducer 100.

The test signal $V_{stim1}$, being an a.c. type signal, oscillates at a frequency F between first and second voltages. In the example illustrated in FIG. 2*b*, the first and second voltages are respectively ground, i.e. 0 v, and +0.5 v, i.e. the amplitude A of the test signal $V_{stim1}$ is 0.5 v. It is noted that the amplitude A and/or frequency F and/or form, i.e. shape, of the test signal, may be varied and/or adapted without departing from the scope of the present invention. Some examples of the type of waveform that could be used to create a test signal comprise a: sine wave; triangular wave; saw-tooth wave; a complex waveform. Therefore, the test signal can be readily adapted so as to optimise the test requirements.

FIGS. 2*c* to 2*e* illustrate a selection of non-exhaustive examples of how the test signal $V_{stim1}$ may have its amplitude, frequency and/or form adapted according to the present invention. For example, FIG. 2*c* shows a test signal having a constant frequency, but a variable amplitude. FIG. 2*d* shows a test signal having a variable frequency, but a constant amplitude. FIG. 2*e* shows a test signal in the form of an AC signal having a particular frequency and/or amplitude. In an alternative embodiment the test signal $V_{stim1}$ may comprise a signal that is swept through a particular range of frequencies, with or without varying amplitude. Such an embodiment may be used when it is desired to determine the resonant frequency of the microphone, for example to characterise the microphone or determine bandwidth requirements for later processing. This can include characterising the "tautness" i.e. stiffness or compliance, of the microphone membrane based on its resonant frequency. In yet another alternative embodiment, the test signal $V_{stim1}$ may be an "excessive" signal that would not readily be expected in everyday use of the MEMS device. Such an "excessive" i.e. overload, signal can be used to test, for example, the recovery time of the transducer ($C_{MEMS}$) and circuitry (102).

The signal source 706 for generating the test signal $V_{stim1}$ may be provided either on-chip, as illustrated, or off-chip. For example, the test signal $V_{stim1}$ may be derived from an on-chip oscillator, or it may be supplied by, divided down from, an externally supplied clock wave. Alternatively, the test signal $V_{stim1}$ can be brought onto the chip 102 via a test pin (not illustrated), or an existing pin (Aout, Dout etc.) that is reconfigured during the test mode of operation. In a further embodiment, the test signal $V_{stim1}$ may be derived partly from a signal received off-chip and partly from circuitry provided on-chip. For example, a digital signal could be received from off-chip, which is passed through a DAC provided on-chip to generate an analogue test signal ($V_{stim1}$).

Many other test scenarios, types of signal and methods of supplying or generating signals will be readily appreciated and understood by those skilled in the art, and are intended to be embraced by the present invention.

Figure 2F:
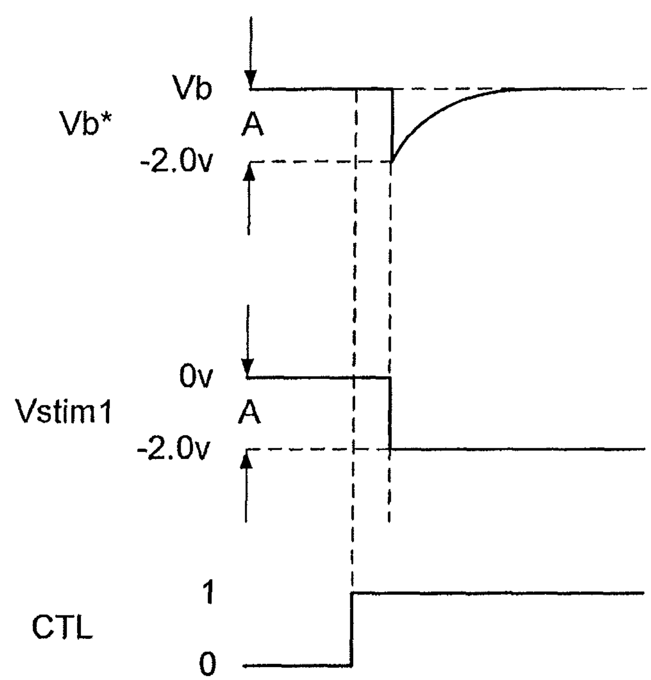

One such scenario is illustrated in FIG. 2*f* which is similar to FIG. 2*b*.

However, in FIG. 2*f* the test signal switches between first and third voltages, wherein the first voltage is 0 v (as before) and the third voltage is a negative voltage: −2.0 v in this example.

Thus, FIG. 2*f* illustrates example signals and voltages associated with a test arrangement that can be used, on the circuit illustrated in FIG. 2*a*, to test the recovery time of the charge pump 104. In other words, the test signal shown in FIG. 2*f* simulates a load on the output of the charge pump 104. It should be noted that the dynamic response of the charge pump 104 to a transient or series of transient signals may be made either with or without a connection, i.e. bond wire 112, to the transducer 100.

Referring to FIG. 2*a*, the control signal CTL enables, i.e. switches on, the switch 704. The enabled switch 704 thereby connects the test signal $V_{stim1}$ from the signal source 706 to the bottom, i.e. low-side, plate $P_L$ of the reservoir capacitor 108. Therefore, in this test mode relating to the recovery time of the charge pump 104, the test signal $V_{stim1}$ has the effect of biasing the bottom plate $P_L$ of the reservoir capacitor 108 between first and third voltages i.e. the test signal "pumps" (in a negative direction) the bottom plate $P_L$ of the reservoir capacitor 108 thus superimposing the negative test signal $V_{stim1}$ upon the otherwise stable bias voltage Vb that is present on the high-side plate $P_H$ of the reservoir capacitor 108. The diode 106 forward biases, i.e. turns on, and the charge pump 104 supplies current so as to recharge the reservoir capacitor 108 to its former stable voltage i.e. Vb.

It will be appreciated from the above that the arrangement of FIG. 2*a* enables the MEMS device, or parts thereof, to be tested during production, but without having the disadvantages mentioned above. By using a capacitor 108 already present on the electronic circuit 102 the invention enables the MEMS device to be tested without significantly increasing the chip-area required. The invention also has the advantage that the test signal $V_{stim1}$ can be applied in a manner that does not require probing of sensitive nodes, and hence does not damage the electronic circuitry 102. Also, when providing the test source 706 on the same integrated circuit 102, i.e, on-chip, the invention does not place any burden on the number of I/O pads being used.

Although the arrangement of FIG. 2*a* has many advantages over the prior art, one disadvantage of this arrangement is that any noise introduced by the switch 704 itself may be passed onto the node 107 that biases one plate 118 of the MEMS capacitor $C_{MEMS}$. Obviously if the switch 704 does not introduce any noise, or if the noise introduced is tolerable for the MEMS device in question, then the arrangement of FIG. 2*a* may well be suitable for use. In the case of a MOS switch 704, any noise introduced onto node 107 may be thermal channel noise or may be supply noise coupled from the digital circuitry driving the gate. Also, it may be such that the test signal $V_{stim1}$ may be corrupted by extraneous signals coupling onto the test signal as it is routed across the chip, i.e. crosstalk. As mentioned earlier, noise on node 107 may be problematic since, if present, it will pass across the MEMS capacitor $C_{MEMS}$ and may be indistinguishable from the voltage signal, i.e. MEMS signal, output from the MEMS capacitor $C_{MEMS}$.

Figure 3:
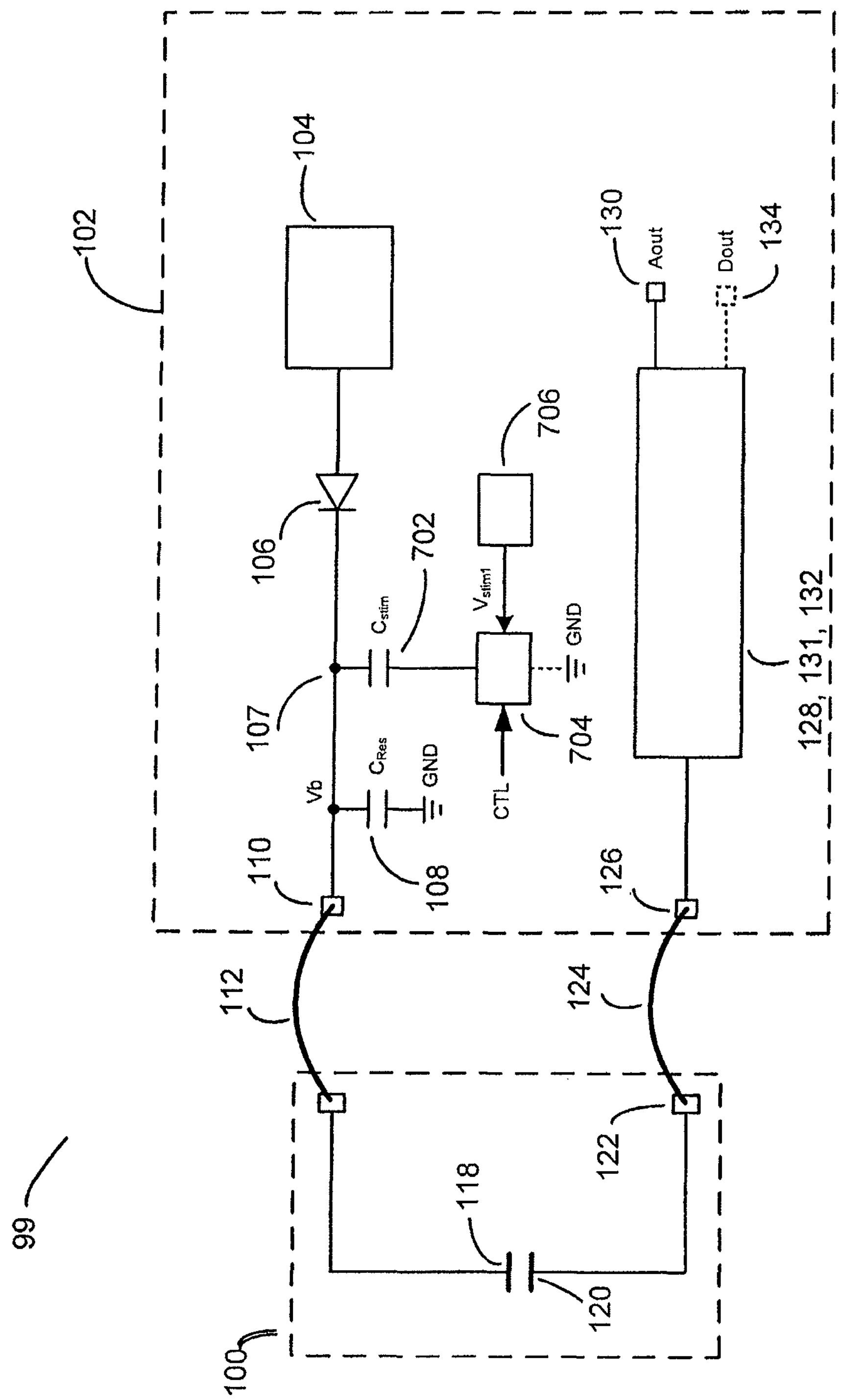
FIG. 3 is a schematic diagram of a MEMS transducer interfaced with electronic circuitry, and having a circuit for testing the MEMS transducer and/or the electronic circuitry according to another embodiment of the invention.

Thus, according to another aspect of the invention there is provided an arrangement shown in FIG. 3. FIG. 3 is similar to the arrangement of FIGS. 1 and 2*a*, with common features having common reference numbers. It is noted that certain features have been simplified for clarity in order to highlight the invention. According to the arrangement of FIG. 3, a capacitor 702 ($C_{stim}$) is provided for selectively connecting the test signal $V_{stim1}$ from the signal source 706 to the MEMS capacitor $C_{MEMS}$. According to one embodiment the capacitor 702 ($C_{stim}$) has a value smaller than the value of the normal reservoir capacitor 108 ($C_{Res}$), for example about 1-5 pF compared to a reservoir capacitor 108 of about 10-50 pF. It will be appreciated that capacitor values and ratios other than those illustrated above are envisaged by the inventor and may be used without departing from the invention as defined in the appended claims. As such, a node 107 in the circuit (for connection to the MEMS capacitor $C_{MEMS}$) is coupled to a first plate of the capacitor 702, the second plate of the capacitor 702 being coupled, via the switch 704, to selectively receive a test signal during a test mode of operation As can be seen from FIG. 3, the switch 704 is provided for selectively connecting, by means of a control signal (CTL), the first test signal $V_{stim1}$ to the node 107 via the capacitor 702 ($C_{stim}$). Since the capacitance of the capacitor 702 (about 1-5 pF) is smaller than the typical capacitance of the reservoir capacitor 108 (about 10-50 pf), this arrangement has the advantage of minimising the effect of any noise generated by the switch 704 or present on the test signal $V_{stim1}$. In other words, since the smaller capacitor 702 is connected in series with the larger reservoir capacitor 108, any noise generated, or passed, by the switch 704 and passed via the capacitor 702 onto node 107 will have a reduced effect due to the presence of the larger reservoir capacitor 108. For example, if the value of the capacitor 702 is 10% of the value of the capacitor 108, then the test signal $V_{stim1}$ passing through the capacitor 702 is approximately only 10% of that which would otherwise have been connected though the capacitor 108 in the arrangement of FIG. 2*a*.

As with FIG. 2*a*, it is noted that any form of test signal $V_{stim1}$ may be provided by the test source 706, and that the test source 706 may be provided either on-chip and/or off-chip.

Therefore, as with the embodiment of FIG. 2*a*, the arrangement shown in FIG. 3 enables a MEMS device to be tested during production, but without having any of the disadvantages associated with the prior art. Furthermore, the arrangement of FIG. 3 reduces the effect of any noise that may be introduced by the switch 704 or coupled onto signal $V_{stim1}$.

Figure 4:
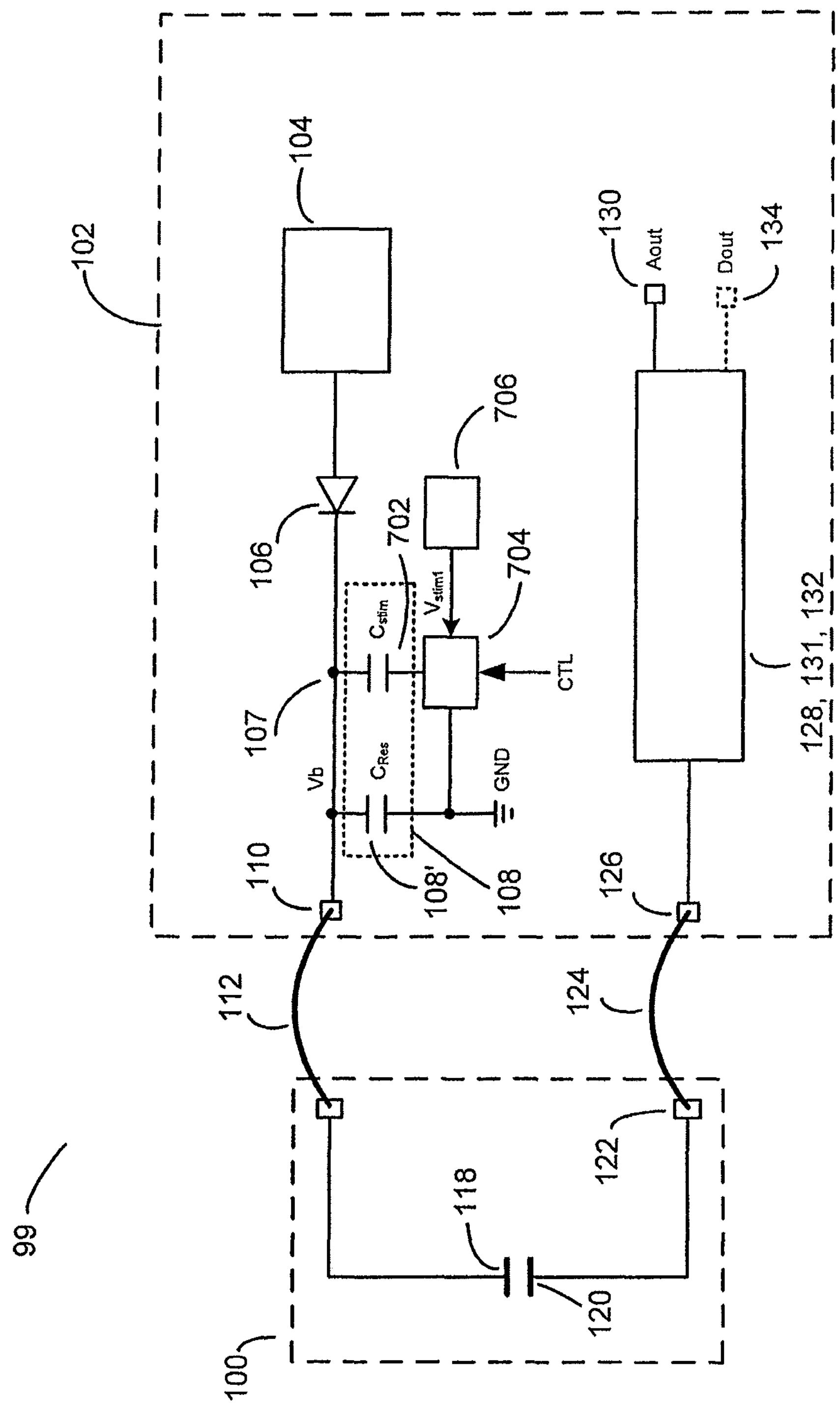
FIG. 4 is a schematic diagram of a MEMS transducer interfaced with electronic circuitry, and having a circuit for testing the MEMS transducer and/or the electronic circuitry according to another embodiment of the invention.

There is a general desire to avoid any increase to the die area of an integrated circuit. Therefore, according to a further embodiment of the present invention, FIG. 4 shows an arrangement in which the reservoir capacitor 108 illustrated in FIG. 3 is, in FIG. 4, made up from first and second reservoir capacitors. Capacitor 702 illustrated in FIG. 3 may, in FIG. 4, be connected in parallel to a reduced size reservoir capacitor 108' when capacitor 702 is not being used in a test mode of operation, i.e. not being used to connect the test signal $V_{stim1}$ to the node 107. Thus, in FIG. 4, the switch 704 is configured to selectively connect the capacitor 702 in parallel with the reduced size reservoir capacitor 108', or to the test signal $V_{stim1}$. As such, during a "normal" mode of operation, i.e. a non-test mode of operation, the capacitor 702 contributes to the overall reservoir capacitance 108, as illustrated in FIG. 3. For the purposes of clarification, $C_{Res}$ (108)=$C_{Res}'$ (108')+$C_{stim}$ (702). Or in other words, a part of the previously optimised reservoir capacitance is "stolen" to implement $C_{stim}$ in test mode, but is returned for use as part of $C_{Res}$ during normal operation.

The arrangement in FIG. 4 enables the original reservoir capacitor 108 ($C_{Res}$), as per FIG. 3, to be reduced in size, if desired, such that the overall die size is not increased as a result of providing the capacitor 702. It is noted that suitable values for the capacitors 108 and 702 may be chosen according to a particular application. For example, if a reservoir capacitance 108 of 50*pf* is desired, a reduced size reservoir capacitance 108' of 45 pf may be used with a capacitor value 702 ($C_{stim}$) of 5 pf. As stated above, other values or other ratios may be used without departing from the scope of the present invention.

It is noted that, although the capacitor 702 ($C_{stim}$) and the main reservoir capacitor 108' are shown as being connected to a ground reference during the "normal" mode of operation, they may be connected to a common reference voltage other than ground.

As described above with FIG. 2*a*, it is noted that the signal source 706 in the embodiments of FIGS. 3 and 4 may be provided either on-chip or off-chip. Likewise, the signal source 706 may be configured to provide any form of test signal $V_{stim1}$ and again is not limited to any particular test signal $V_{stim1}$.

Figure 5:
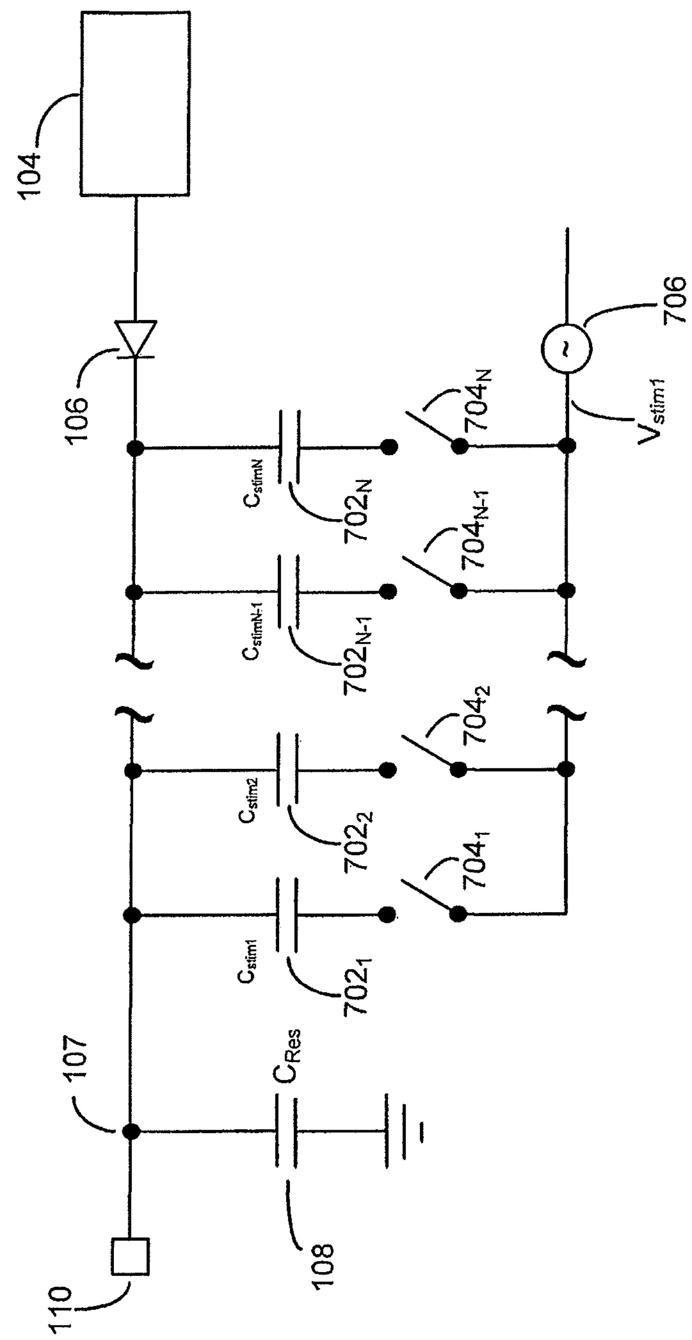
FIG. 5 is a schematic diagram of a circuit for testing the MEMS transducer and/or the electronic circuitry according to another embodiment of the invention.

According to a further aspect of the present invention, FIG. 5 shows a bank of capacitors $\mathbf{702}_1$ to $\mathbf{702}_N$ being provided to connect the test signal $V_{stim1}$ to the node 107. Each of the capacitors $\mathbf{702}_1$ to $\mathbf{702}_N$ has a corresponding switch $\mathbf{704}_1$ to $\mathbf{704}_N$ for connecting the respective capacitor to the signal source 706. The capacitors $\mathbf{702}_1$ to $\mathbf{702}_N$ may have substantially equal values or may have different values, for example binary weighted values, in both cases enabling different amounts of voltage, ΔV, to be applied to the node 107 by using various combinations of capacitors $\mathbf{702}_1$-$\mathbf{702}_N$. That is to say, for the same value of test signal $V_{stim1}$, different changes in voltage, ΔV, can be applied to the output node 107 depending upon the capacitor ratios.

Figure 6:
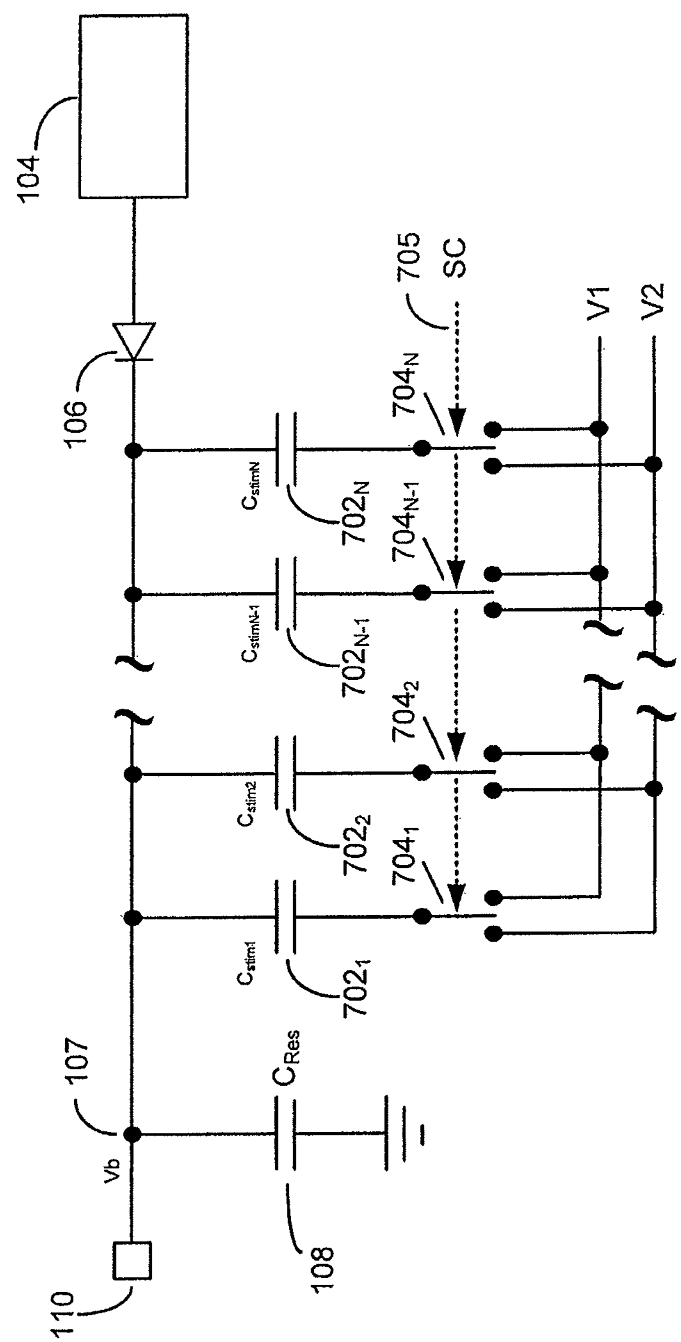
FIG. 6 is a schematic diagram of a circuit for testing the MEMS transducer and/or the electronic circuitry according to another embodiment of the invention.

According to a further aspect of the present invention, FIG. 6 shows a bank of capacitors $\mathbf{702}_1$-$\mathbf{702}_N$ and corresponding bank of switches $\mathbf{704}_1$ to $\mathbf{704}_N$. The bank of capacitors $\mathbf{702}_1$-$\mathbf{702}_N$ can have substantially equal values or may have different values, for example binary weighted values. Each of the capacitors $\mathbf{702}_1$-$\mathbf{702}_N$ has a first plate connected to the node 107, and a second plate connected to a respective switch $\mathbf{704}_1$ to $\mathbf{704}_N$. The switches $\mathbf{704}_1$ to $\mathbf{704}_N$ are configured to selectively connect the second plate of the respective capacitor $\mathbf{702}_1$-$\mathbf{702}_N$ to a first voltage (V1) and a second voltage (V2) according to digital control signal(s) 705 (SC) which controls the operation of the switches $\mathbf{704}_1$ to $\mathbf{704}_N$. It is noted that the digital control signal(s) 705 can either be received from an off-chip source (i.e. via a dedicated I/O pad or another I/O pad which is assigned for this purpose during the test mode), or received from an on-chip source, for example a ROM, EPROM, RAM or similar memory device.

As an example of how the arrangement of FIG. 6 may be used in practice is illustrated in FIGS. 7*a*-7*c*.

Referring to both FIGS. 6 and 7, and assuming the following: that there are four capacitors, i.e. N=4; the values of capacitor $C_{stim1}$=$C_{stim4}$; the value of capacitor $C_{stim2}$=$C_{stim3}$: the value of $C_{stim2}$ equals twice the value of $C_{stim1}$; V2>V1; and V2-V1=ΔV.

Switching the bottom plate of $C_{Stim1}$ (or $C_{stim4}$) from V1 to V2 (ΔV) results in a change in the bias voltage Vb of:

$$\frac{(V2-V1).C_{Stim1}}{C_{Res}+\sum Ci}=\frac{\Delta V.C_{Stim1}}{C_{Res}+\sum Ci}=\Delta Vb$$

Switching the bottom plate of $C_{Stim2}$ (or $C_{stim3}$) from V1 to V2 (ΔV) results in a change in the bias voltage Vb voltage of:

$$\frac{(V2-V1).C_{Stim2}}{C_{Res}+\sum Ci}=\frac{(V2-V1).2.C_{Stim1}}{C_{Res}+\sum Ci}=\frac{\Delta V.2.C_{Stim1}}{C_{Res}+\sum Ci}=2.\Delta Vb$$

Conversely, switching the bottom plate of $C_{Stim1}$ (or $C_{stim4}$) from V2 to V1 (−ΔV) results in a change in the bias voltage Vb voltage of:

$$\frac{(V2-V1).C_{Stim1}}{C_{Res}+\sum Ci}=\frac{-\Delta V.C_{Stim1}}{C_{Res}+\sum Ci}=-\Delta Vb$$

And switching the bottom plate of $C_{Stim2}$ (or $C_{stim3}$) from V2 to V1 (−ΔV) results in a change in the bias voltage Vb voltage of:

$$\frac{(V2-V1).C_{Stim2}}{C_{Res}+\sum Ci}=\frac{(V2-V1).2.C_{Stim1}}{C_{Res}+\sum Ci}=\frac{-\Delta V.2.C_{Stim1}}{C_{Res}+\sum Ci}=-2.\Delta Vb$$

FIG. 7*a* illustrates the test signal waveform, that is superimposed upon the bias Voltage Vb, which is generated by switching the bottom plates of the four capacitors $C_{Stim1}$-$C_{Stim4}$ in the sequence illustrated by the four switch control signal SC1-SC4, as illustrated in FIG. 7*b*. The test signal waveform is an approximation of a sine wave test signal that is illustrated by the dotted line 800.

FIG. 7*c* is a visual representation of what voltages are applied to the bottom plates of the $C_{StimN}$ capacitors at the respective times t1-t8 (as illustrated in FIG. 7*b*).

Typically one of the voltages, either V1 or V2, illustrated in FIGS. 6 and 7 is ground although the circuit and switches of FIG. 6 may be adapted such that other voltages (V3-VN) may be used in the testing of the MEMS device.

Thus, in non-test mode, switches $\mathbf{704}_1$ to $\mathbf{704}_N$ are configured to selectively connect the bottom plates of the capacitors $C_{Stim1}$-$C_{StimN}$ to a fixed voltage, preferably ground, so that the capacitors are returned to use as part of $C_{Res}$. If N voltages are supplied for generating a test signal then this requires that each switch to have N possible modes, i.e. connecting the bottom plate to V1, V2, or VN. If one of V1 or V2 is equal to ground, say, or is some other very quiet reference voltage, then connection to this voltage may be used during non-test operation.

The arrangement shown in FIG. 6 thus enables a plurality of different types of test signal to be generated (including a test signal that approximates a sine wave) depending on the control signals SC1-SC4 applied.

Each of the embodiments described above has the advantage of enabling the MEMS device to be tested during production in the absence of an acoustic stimulus for moving a membrane of the MEMS capacitor.

Further details will now be given concerning how the testing procedures can be carried out in relation to the fabrication or manufacture of a MEMS device.

Figure 8:
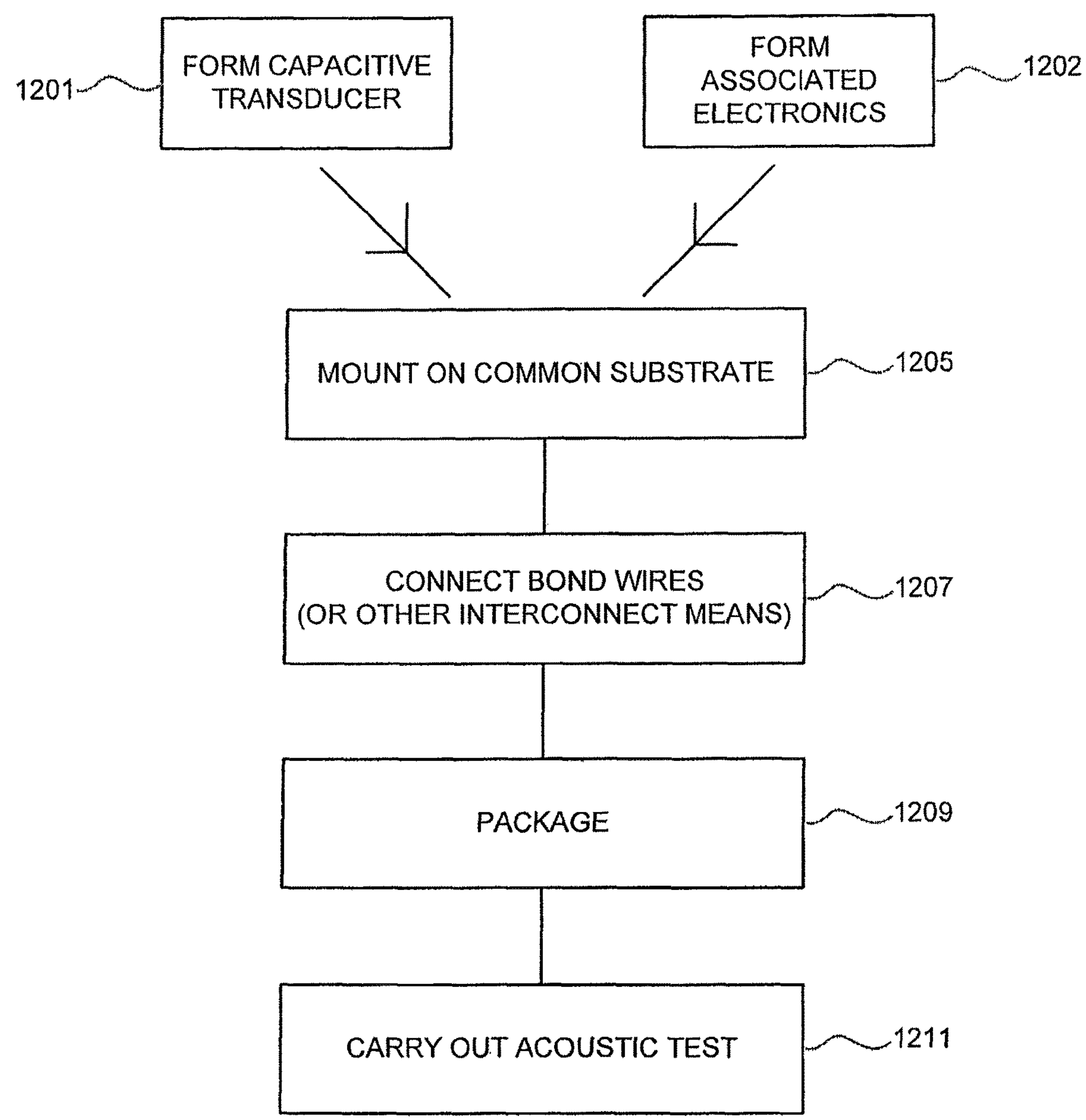
FIG. 8 is a flow chart showing the steps performed in a conventional testing procedure.

FIG. 8 shows the traditional steps involved in the manufacture of a MEMS device whereby the MEMS transducer is formed on a first integrated circuit in step 1201, while the associated electronic circuit is formed on a separate integrated circuit in step 1202. The individual integrated circuits for the MEMS transducer and associated electronic circuit may be formed in a number of different ways, including the use of separate wafers whereby each wafer contains a large number of each integrated circuit, which are then singulated or diced to provide the individual integrated circuit dies required for steps 1201 and 1202.

In step 1205 the individual MEMS transducer IC and individual electronic circuit IC are mounted on a common substrate. Bond wires (or any other mechanism for connecting the two circuits) are then used to electrically connect the MEMS transducer with the associated electronic circuit, step 1207. This step may also involve adding bond wires between the respective circuits and the bond pads or connections that interface the final packaged device with the outside world.

Once the circuit has been electrically connected in step 1207 the device is then packaged in step 1209. This may include one or more of the following processes: addition of a protective layer to protect the device from environmental parameters; addition of a sealed package; addition of a lid having an acoustic hole. Other packaging processes may also be used.

The fully assembled MEMS device can then be tested in step 1211 by applying an acoustic stimulus for driving the moveable membrane of the capacitive transducer, and observing the output signal to determine if the device is faulty or working.

It will be appreciated that this form of testing is not ideally suited for high volume manufacture, since the step of providing an accurate acoustic stimulus can be relatively difficult to perform. Furthermore, performing the test after the final stage of assembly is not cost effective, since a faulty transducer or electronic circuit may have been fully assembled unnecessarily. In addition, the use of traditional probing techniques to probe certain nodes prior to the device being packaged can damage sensitive nodes on the electronic circuitry.

Figure 9:
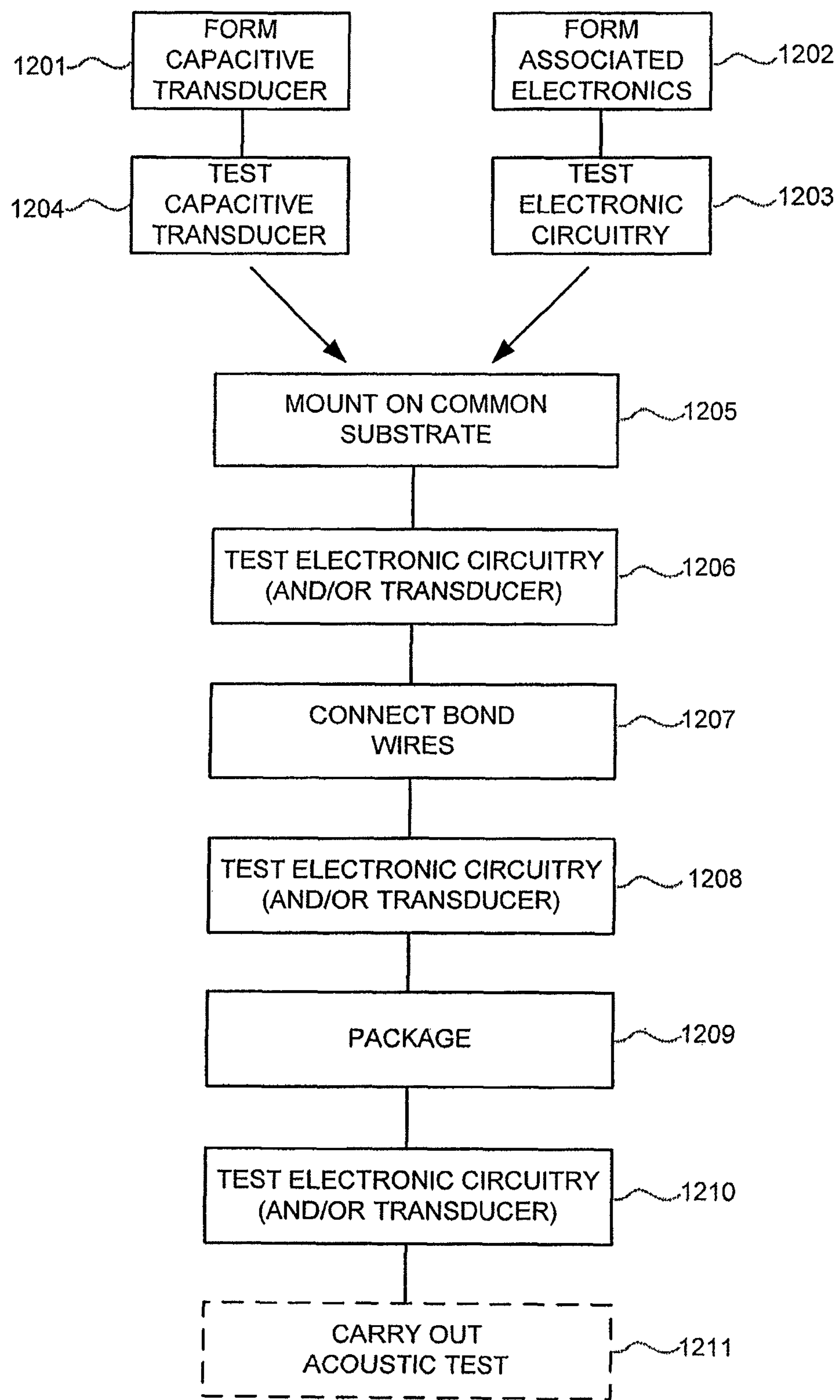
FIG. 9 is a flow chart showing the steps performed in a method of testing according to another aspect of the present invention.

According to a further aspect of the present invention, FIG. 9 describes the steps involved in testing a MEMS device during a manufacturing process.

In step 1201 a MEMS transducer is formed on a first integrated circuit, and in step 1202 the associated electronic circuit is formed on a separate integrated circuit. As mentioned above, the individual integrated circuits for the MEMS transducer and associated electronic circuit may be formed in a number of different ways, including the use of separate wafers whereby each wafer contains a large number of each integrated circuit, which are then singulated or diced to provide the individual integrated circuit dies required for steps 1201 and 1202.

According to the invention, in step 1203 the electronic circuit may be tested using any of the methods described above in relation to the embodiments of FIGS. 2*a*, 3, 4, 5 and 6. For example, the functioning of the reservoir capacitor, and its interconnection to the bond pad 112 and charge pump 104 can be tested. Also, the dynamic recovery of the charge pump 104 may be tested. As a consequence, any defective parts can be discarded prior to being used in the assembly process.

The MEMS transducer may also be tested in step 1204.

In step 1205 the individual MEMS transducer IC and individual electronic circuit IC are mounted on a common substrate.

However, prior to adding bond wires in step 1207 (or any other mechanism for connecting the two circuits), the electronic circuit can first be tested in step 1206 using any of the methods described in FIGS. 2*a*, 3, 4, 5 and 6. Also, if desired, the MEMS transducer can be tested at this point.

This enables the individual devices to be tested after being mounted on the common substrate, but prior to the bond wires being connected, to determine whether or not this processing step has damaged either of the integrated circuits.

In step 1207 bond wires (or any other mechanism for connecting the two circuits) are used to electrically connect the MEMS transducer with the associated electronic circuit. This step may also involve adding bond wires between the respective circuits and the bond pads or connections that interface the final packaged device with the outside world.

Once the MEMS transducer and electronic circuitry have been electrically connected, the MEMS transducer and associated circuitry can then be tested in step 1208 using any of the methods described above in relation to FIGS. 2*a*, 3, 4, 5 and 6. For example, the switch 704 can be activated to couple the test signal $V_{stim}$ through the MEMS microphone to the electronic circuit 102. This enables the signal path to be tested. For example, by monitoring the output signal the test mode enables the continuity of the path to the MEMS microphone (i.e. via the bond pads 110, 114 and bond wire 112), and from the MEMS microphone to the electronic circuitry (i.e. via bond pads 122, 126 and bond wire 124) to be tested. The test signal also enables the MEMS microphone itself to be tested, and the performance of the LNA 128 circuitry.

From the above it will be appreciated that the MEMS transducer, interconnection nodes and electronic circuitry can be tested prior to the assembled device being packaged, without requiring additional test pins, without needing to probe sensitive nodes, and without requiring an acoustic stimulus.

Once the assembled device has been tested as noted above, the device can then be packaged in step 1209. As mentioned above, this may include one or more of the following processes: addition of a protective layer to protect the device from environmental parameters; addition of a sealed package; addition of a lid having an acoustic hole. Other packaging processes may also be used.

The fully assembled MEMS device can then be tested in step 1210 using any of the techniques described above. For example, the switch 704 can be activated to couple the test signal $V_{stim}$ through the MEMS microphone to the electronic circuit 102. This enables the signal path to be tested. For example, by monitoring the output signal the test mode enables the continuity of the path to the MEMS microphone (i.e. via the bond pads 110, 114 and bond wire 112), and from the MEMS microphone to the electronic circuitry (i.e. via bond pads 122, 126 and bond wire 124) to be tested. The test signal also enables the MEMS microphone itself to be tested, and the performance of the LNA 128 circuitry.

It will be appreciated that the MEMS transducer, interconnection nodes and electronic circuitry can be tested after being packaged (i.e. when probing is no longer possible), without requiring an acoustic stimulus. The testing also avoids the need for additional test pins.

Finally, if desired, in step 1211 a further test can be carried out, for example on a random basis rather than on every device, whereby an acoustic stimulus is applied for driving the moveable membrane of the capacitive transducer, and observing the output signal to determine if the device is faulty or working.

FIG. 9 describes a manufacturing process whereby the MEMS microphone 100 and the electronic circuit 102 are formed on separate integrated circuits, with bond pads and bond wires connecting the separate integrated circuits, which are then packaged on a common substrate.

However, it will be appreciated that the MEMS microphone 100 and electronic circuit 102 can also be formed on the same integrated circuit within the packaged device, i.e rather than on two separate integrated circuits. It will be appreciated that in this case the bond pads and bond wires can be avoided. However, the testing method and circuit described in relation to FIGS. 2*a*, 3, 4, 5 and 6 may still be used even when the bond pads and bond wires are not present. In other words, the injection of a test signal via the capacitor 108 and/or capacitor 702 may also be carried out in a fully integrated solution when the MEMS device and electronic circuit are all provided on the same integrated circuit.

As mentioned above, although the various embodiments describe a MEMS capacitive microphone, the invention is also applicable to any form of capacitive transducer, including non-MEMS devices, and including transducers other than microphones, for example accelerometers or ultrasonic transmitters/receivers.

It is noted that the embodiments described above may be used in a range of devices, including, but not limited to, analogue microphones, digital microphones, accelerometers or ultrasonic transducers. The invention may also be used in a number of applications, including, but not limited to, consumer applications, medical applications, industrial applications and automotive applications. For example, typical consumer applications include portable audio players, laptops, mobile phones, PDAs and personal computers. Typical medical applications include hearing aids. Typical industrial applications include active noise cancellation. Typical automotive applications include hands-free sets, acoustic crash sensors and active noise cancellation.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference signs in the claims shall not be construed so as to limit their scope.

What is claimed is:

1. An integrated circuit for use with a MEMS capacitive transducer having a MEMS capacitor, the integrated circuit comprising:

a biasing node for outputting an output voltage to a first plate of the MEMS capacitor;

a first circuit node for receiving, in a test mode of operation, a test signal from an off-chip test signal generator;

switching circuitry configured to selectively establish, in the test mode of operation, a test signal path between the first circuit node and the biasing node to supply the test signal from said first circuit node to the biasing node;

wherein said test signal path comprises a first capacitor configured such that the test signal is supplied from said first circuit node to the biasing node via the first capacitor.

2. The integrated circuit as claimed in claim 1, wherein the switching circuitry is operable such that in a non-test mode of operation the biasing node is disconnected from the first circuit node.

3. The integrated circuit as claimed in claim 1, wherein the switching circuitry is operable such that in the test mode of operation a first plate of the first capacitor is coupled to said biasing node and a second plate of the first capacitor is coupled to said first circuit node.

4. The integrated circuit as claimed in claim 3, wherein the switching circuitry is operable to selectively couple the second plate of the first capacitor to a reference voltage during a non-test mode of operation, with the first plate of the first capacitor coupled to the biasing node.

5. The integrated circuit as claimed in claim 4, wherein the switching circuitry is configured such that, in the non-test mode of operation, the first capacitor is connected in parallel with at least a second capacitor.

6. The integrated circuit as claimed in claim 4, wherein said reference voltage is a non-zero reference voltage.

7. The integrated circuit as claimed in claim 1, wherein the first circuit node is a first circuit pad or pin.

8. The integrated circuit as claimed in claim 1, wherein the first circuit node is a dedicated test pin or pad.

9. The integrated circuit as claimed in claim 1, wherein, in the non-test mode of operation, the first circuit node is connected to a different signal path for input or output of non-test signals.

10. The integrated circuit as claimed in claim 1, wherein the test signal path further comprises a digital-to-analogue converter located between the first circuit node and the first capacitor.

11. The integrated circuit as claimed in claim 1, wherein the switching circuitry is controlled in the test or non-test mode of operation in response to a test control signal.

12. The integrated circuit as claimed in claim 11, wherein the test control signal is received from an off-chip controller.

13. The integrated circuit as claimed in claim 1, comprising a charge pump configured to generate said voltage at said biasing node.

14. The apparatus comprising an integrated circuit as claimed in claim 1, a wherein said MEMS capacitive transducer is connected to said biasing node.

15. The apparatus as claimed in claim 14, wherein said MEMS capacitive transducer is integrated as part of the integrated circuit.

16. The electronic device comprising an integrated circuit as claimed in claim 1, wherein said electronic device is at least one of: a consumer device; a medical device; an automotive device; a portable device; an audio player; a laptop; a mobile telephone; and a computing device.

17. An integrated circuit, comprising:

a biasing node for supplying a bias voltage to a MEMS capacitive transducer;

a first capacitor having a first plate and a second plate, wherein said first plate of said first capacitor is electrically connected to said biasing node; and switch circuitry electrically connected to said second plate of said first capacitor, wherein said switch circuitry is operable:

in a test mode of operation to electrically couple said second plate of said first capacitor to a test node for receiving a test signal generated externally from the integrated circuit; and in a non-test mode to disconnect the first capacitor from the test node.

18. The integrated circuit as claimed in claim 17, wherein the switch circuitry is operable, in the non-test mode of operation, to electrically connect the second plate of said first capacitor to a reference voltage.

* * * * *